(12) United States Patent
Drake et al.

(10) Patent No.: US 7,672,095 B2
(45) Date of Patent: Mar. 2, 2010

(54) RELAY CONTROLLER

(75) Inventors: Dean A. Drake, St. Peters, MO (US);
Gregg Mueller, St. Louis, MO (US);
George E. Hendrix, Florissant, MO (US)

(73) Assignee: Emerson Electric Co., St. Louis, MO (US)

( * ) Notice: Subject to any disclaimer, the term of this patent is extended or adjusted under 35 U.S.C. 154(b) by 80 days.

(21) Appl. No.: 11/875,341

(22) Filed: Oct. 19, 2007

(65) Prior Publication Data
US 2008/0089000 A1  Apr. 17, 2008

Related U.S. Application Data

(63) Continuation of application No. 11/366,157, filed on Mar. 2, 2006, now Pat. No. 7,298,148.

(51) Int. Cl.
*H02H 3/00* (2006.01)
(52) U.S. Cl. .......................... 361/2; 361/170
(58) Field of Classification Search ............. 361/2, 361/170, 93.1, 93.2, 93.5, 93.7, 93.9, 101
See application file for complete search history.

(56) References Cited

U.S. PATENT DOCUMENTS

| | | | | |
|---|---|---|---|---|
| 4,769,737 A | | 9/1988 | Ogita et al. | 361/203 |
| 4,857,926 A | * | 8/1989 | Neglia et al. | 341/116 |
| 4,914,315 A | | 4/1990 | Nickolai | 307/137 |
| 5,267,120 A | | 11/1993 | Graff | 361/185 |
| 5,329,417 A | | 7/1994 | Kniepkamp | 361/185 |
| 5,416,404 A | | 5/1995 | Baldwin | 323/235 |
| 5,530,615 A | | 6/1996 | Miller | 361/160 |
| 5,640,113 A | | 6/1997 | Hu | 327/167 |
| 5,777,301 A | | 7/1998 | Kim | 219/721 |
| 5,804,991 A | | 9/1998 | Hu | 327/162 |
| 6,119,950 A | | 9/2000 | Albanello | 236/46 |
| 6,137,193 A | | 10/2000 | Kikuoka | 307/137 |
| 6,233,132 B1 | | 5/2001 | Jenski | 361/160 |
| 6,392,390 B1 | * | 5/2002 | Ito et al. | 323/209 |
| 6,768,615 B2 | | 7/2004 | Liu | 361/2 |
| 2005/0157443 A1 | * | 7/2005 | Bryan et al. | 361/118 |
| 2006/0114635 A1 | | 6/2006 | Laurent et al. | 361/160 |

* cited by examiner

*Primary Examiner*—Jared J Fureman
*Assistant Examiner*—Nicholas Ieva
(74) *Attorney, Agent, or Firm*—Harness, Dickey & Pierce, P.L.C.

(57) ABSTRACT

A relay controller for connecting a power source includes at least one relay having at least two contacts. The relay controller includes a processing device operable to selectively switch the relay contacts, and a feedback circuit adapted to identify an actual state of the relay contacts. The processing device is configured to recognize a fault contact condition of a disparity between an expected state of the relay contacts and the actual state of the relay contacts. The processing device is also configured to responsively communicate information relating to the relay fault condition.

20 Claims, 9 Drawing Sheets

RELAY CONTROLLER

FIELD OF THE INVENTION

The present invention relates generally to relay controllers, and more particularly to communicating relay controllers.

BACKGROUND OF THE INVENTION

A relay controller circuit may generally include a processing device and a relay having contacts. The contacts are driven by the processing device to an open position or a close position, depending on the desired output of the relay. In various applications of the relay controller, the relay may be switched frequently throughout its lifetime. The number of switches in its lifetime, along with conditions under which the relay is switched, causes the relay contacts to degrade.

The degrading of the relay contacts can cause failures of the relay to switch when commanded by the processing device. The failure may momentarily interrupt normal relay switching operation, or may be permanent. Depending on the degradation of the relay contacts, the relay may still be able to switch and function in the degraded state. If the relay does not switch, the relay has failed, and will not function without repair or replacement.

SUMMARY OF THE INVENTION

The inventor hereof has succeeded at designing relay controllers and methods of operation that are capable of communicating a service requirement. The communicating of the service requirement can diminish or eliminate system down time and prevent damage to critical components by communicating service requirements before a failure of the relay.

According to one aspect of the present invention, a relay controller for switching a power source includes at least one relay having at least two contacts, a processing device operable to selectively switch the relay contacts and a feedback circuit adapted to identify an actual state of the relay contacts. The processing device is configured to recognize a fault contact condition. The fault contact condition is a disparity between an expected state of the relay contacts and the actual state of the relay contacts. The processing device is also configured to responsively communicate information relating to the fault condition.

According to another aspect of the present invention, a method of operating a relay controller having at least one relay having at least two contacts includes monitoring an expected state of the relay contacts and an actual state of the relay contacts, upon detection of a fault contact condition, pulsing the relay until the fault contact condition is overcome, and communicating information relating to the fault condition.

According to yet another aspect of the present invention, a relay controller for a relay having a first relay contact and a second relay contact adapted to close to establish an electrical connection between the first and second voltage waveforms and a motor. The relay controller is further associated with a first electrical circuit having input connections adapted for connection to the first and second voltage waveforms. The first electrical circuit is configured to provide a signal denoting a time when each of the first and second waveforms are each at a voltage value other than zero volts, and the difference in voltage potential between the first alternating-current voltage waveform and the second alternating-current voltage waveform is at or near a minimum value, at which time the relay is initially switched to initiate closure of the first and second relay contacts. The relay controller is further associated with a second electrical circuit having input connections with the first and second relay contacts for monitoring the relay contact position, wherein when the relay first and second contacts are closed, the second electrical circuit is configured to provide a signal denoting a time when the relay contacts have closed and opened. The relay controller further includes a microprocessor configured to switch the relay, causing the opening and closing of first and second relay contacts. The microprocessor is configured to monitor the first and second signals to determine a difference in time between when the relay is initially switched where the difference in voltage potential is at or near a minimum value, and when the first and second relay contacts actually close, where the microprocessor utilizes the time difference value in determining a switch initiation time relative to a time where the difference in voltage potential is at or near a minimum value, such that the first and second relay contacts close when the voltage potential between the first and second alternating-current voltage waveforms is at or near a minimum value, to thereby reduce the potential for arcing.

Further aspects of the present invention will be in part apparent and in part pointed out below. It should be understood that various aspects of the invention may be implemented individually or in combination with one another. It should also be understood that the detailed description and drawings, while indicating certain exemplary embodiments of the invention, are intended for purposes of illustration only and should not be construed as limiting the scope of the invention.

BRIEF DESCRIPTION OF THE DRAWINGS

Like reference symbols indicate like elements or features throughout the drawings.

DETAILED DESCRIPTION OF EXEMPLARY EMBODIMENTS

The following description of exemplary embodiments is merely exemplary in nature and is in no way intended to limit the scope of the present invention, its applications, or uses.

Figure 1:
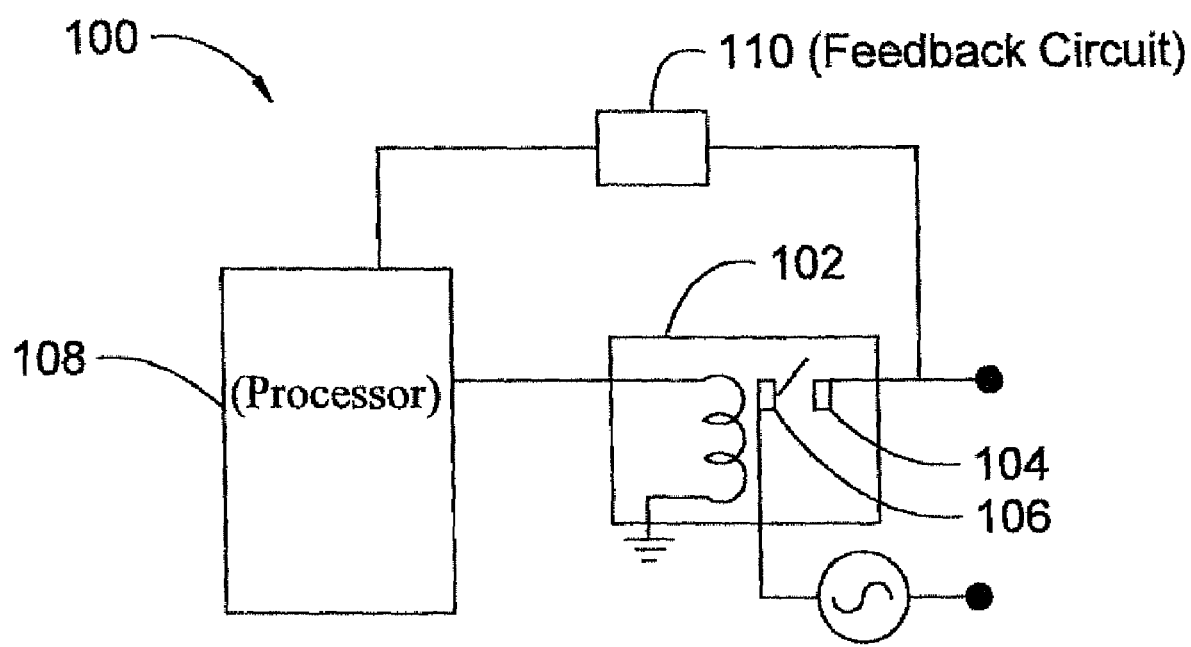
FIG. 1 is a circuit diagram of a relay controller according to one embodiment of the present disclosure.

One embodiment of a relay controller according to the principles of the present specification is illustrated in FIG. 1 and is indicated generally by reference numeral 100. The relay controller 100 includes at least one relay 102 having at least two contacts 104, 106, a processing device 108, and a feedback circuit 110. The processing device 108 is operable to selectively switch the relay contacts 104, 106. The feedback circuit 110 is adapted to identify the actual state of the relay contacts. The processing device is configured to recognize a relay fault or un-expected state of the contacts, and to responsively communicate a signal indicative of the fault or un-expected contact state.

A relay fault condition may be a disparity between an expected state of the relay contacts and the actual state of the relay contacts. The relay controller is operable to selectively switch the relay contacts between an open position and a closed position. The closed position creates an electrical continuity between the contacts, and the open position creates an electrical discontinuity between the contacts. The expected state of the contacts is that state commanded by the processing device, and the actual state of the contacts is the actual open or closed position of the contacts. For example, the relay fault condition may be a contact weld condition. The contact weld condition exists when a weld forms between the contacts to inhibit the transition of the contacts from the closed position to the open position. In another example, the relay fault condition is a failure of the closed position contacts to create electrical continuity between the contacts, due to a high impedance condition. In other embodiments, different types of fault contact conditions can exist depending on at least the type of relay and environmental conditions of operation of the relay.

To overcome a relay fault condition, the processing device may repeat the command or activation signal to the relay. The command or activation signal from the processing device switches the relay to a particular contact state. For example, upon determining a contact weld condition, the processing device may establish a command or activation signal for closing the contacts (which signal may be a voltage to the relay) followed by a command or activation signal for opening the contacts (which signal may be an interruption of voltage). If the actual state of the contacts does not change from the weld condition in response to the command signals, the processing device will detect the continued fault condition and repeat the "pulse" command to the relay. The relay may be "pulsed" until the fault condition is overcome and the actual state of the relay contacts is consistent with the expected state of the relay contacts. In another example in which the contacts are in the closed position but do not have electrical continuity between the contacts, the processing device may establish a command or activation signal for opening the contacts (which signal may be either an interruption or application of voltage to the relay) followed by a command or activation signal for closing the contacts. If the contacts close and establish electrical continuity then the fault condition is overcome, and the actual state of the relay contacts is consistent with the expected state of the relay contacts.

In various embodiments, the processing device is adapted to store information corresponding to a particular fault condition. The information may include pulse characteristics, such as the number of pulses necessary to overcome the particular fault contact condition, or the pulse frequency for overcoming the particular fault contact condition. In some relay controller embodiments, analysis of the faults and pulse characteristics can be used to predict subsequent failure or ultimate failure of the relay. In one embodiment, the analysis comprises comparing the number of pulses required to overcome a fault condition with a predetermined maximum number of allowed pulses stored in the processing device. For example, if the number of pulses required to overcome the fault condition is 5 times and the predetermined maximum is 6 times, the processing device may responsively predict an imminent failure. The predetermined maximum can be a fixed or variable value depending on a number of factors, including the operating load or current conducted, the type of relay, the number of contacts, other components in the system, etc. For example, empirical testing of a specific relay may disclose that the specific relay when operated over 100,000 times or cycles will most likely not overcome a contact weld fault condition, even after 6 successive pulses. The predetermined maximum value may accordingly be set to some number less than 6 times. In other embodiments, the pulse characteristics can be analyzed independent of a predetermined maximum to form a predicted failure based solely on the number of fault occurrences and the number of times the relay has been switched or "cycled".

The processing device may communicate the type of fault condition, and other information such as a predicted failure point for the relay. The communication may include the number of pulses required to overcome the relay fault condition. The analysis of the fault type, pulse characteristics, and number of relay cycles may be used in estimating or predicting a subsequent or ultimate failure of the relay. Accordingly, the fault information and predicted failure can provide a variety of data for the processing device to communicate. Moreover, some applications in which the relay controller may be employed might demand that the relay controller communicate a service requirement for a single fault condition, where the relay is critical to the system. Other applications may be much more fault tolerant and can wait until just before ultimate failure of the relay to communicate diagnostic or service information to an interface or display device. Accordingly, the relay controller may be adaptable to different applications with either critical or non-critical components.

While FIG. 1 illustrates a single relay 102 having two contacts 104 and 106, it should be understood that a different number of contacts or different types of relays can be employed in other embodiments of a relay controller. For example, a latching relay can be employed rather than a normally open single pole switching relay. It should be understood that the present disclosure should not be limited to the particular exemplary embodiments of a processing device 108 and feedback circuit 110, and that and modifications such as relay type may be made without departing from the scope of the claims. Different types or forms of processing devices capable of controlling the operation the required logic operations may be employed. For example, the processing device may be a microprocessor that is configured to send command signals for selectively switching the relay contact.

Furthermore, different types of interface may receive the information communicated by the processing device. The interface may be any device capable of receiving and/or responding to the communication from the processing device. For example, the interface may be an onsite diagnostic reporting device, a hand-held "palm" type device, or a gateway for a remote network. The processing device could also communicate information to a display device integrated into the relay controller, such as an LED (light emitting diode) or an LCD (liquid crystal display) for visually communicating fault information. Various other types of interfaces can be employed depending on the application of the relay controller and the information included in the service requirement.

In another aspect of the present disclosure, various methods for controlling operation of a relay controller are provided. In some embodiments, the method includes monitoring an expected state of the relay contacts and an actual state of the relay contacts, detecting a fault condition in the contacts, and pulsing the relay until the fault condition is overcome. The method may further include communicating the fault condition and/or the pulse characteristics corresponding to the fault condition. In other embodiments of a method, the relay may be switched in a manner that reduces the probability of occurrence of a contact fault condition.

Figure 2:
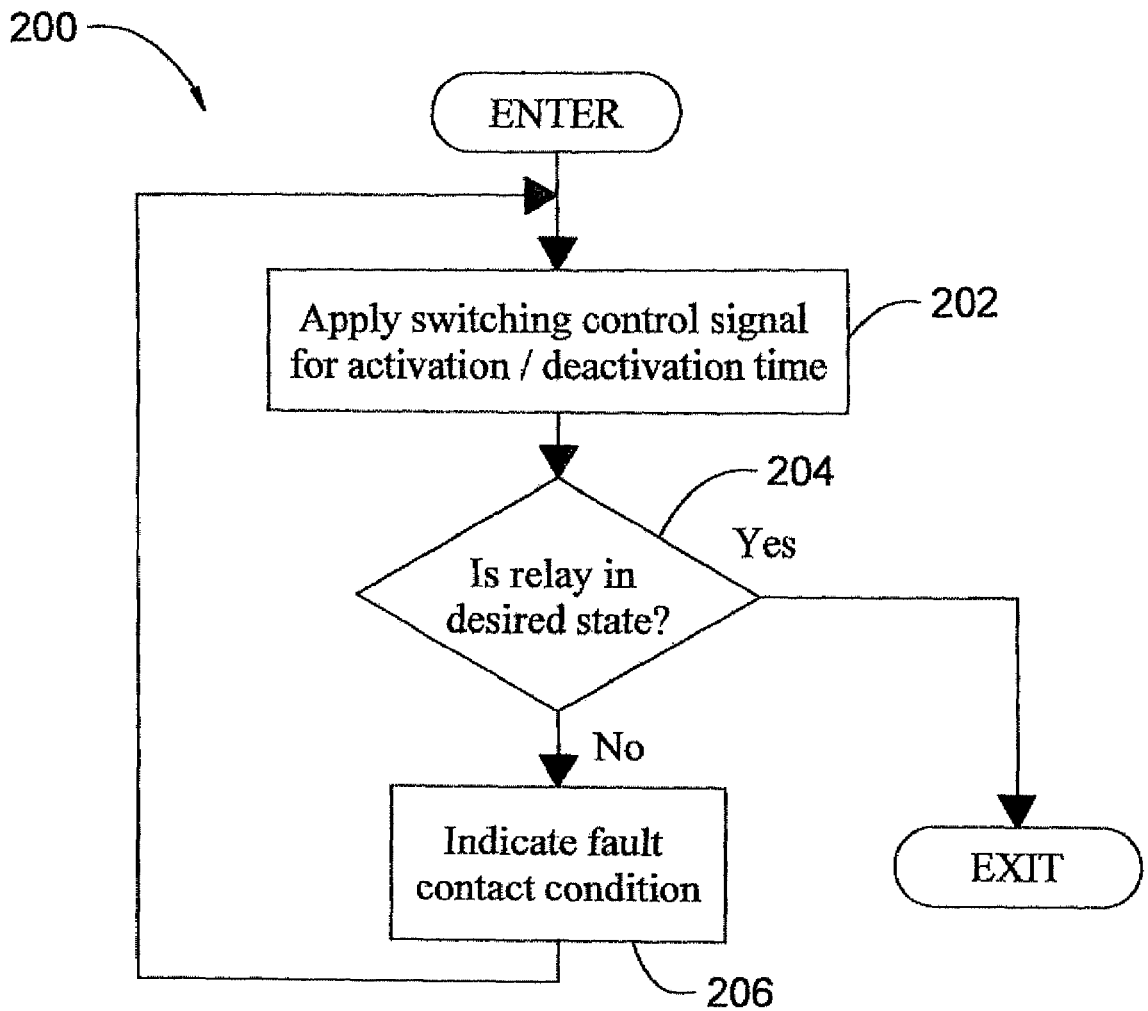
FIG. 2 is a flow chart of one embodiment of a method for controlling the operation of a relay controller.

One embodiment of a method for controlling operation of a relay controller is shown in FIG. 2. The relay controller method begins at step 202 by applying a switch signal to the relay to switch the contacts to a desired state (open or closed contacts). At step 204, the method compares an expected state of the relay contacts to the actual state of the relay contacts. If no disparity exists between the actual state of the relay contacts and the expected state of the relay contacts, the method proceeds to step 208. If a disparity is detected at step 204, the method communicates information relating to the fault condition, and proceeds to step 202 to repeat the signal for switching the relay contacts. The method may be continued or repeated until the expected state of the relay contacts is the same as the actual state of the relay contacts.

Figure 3:
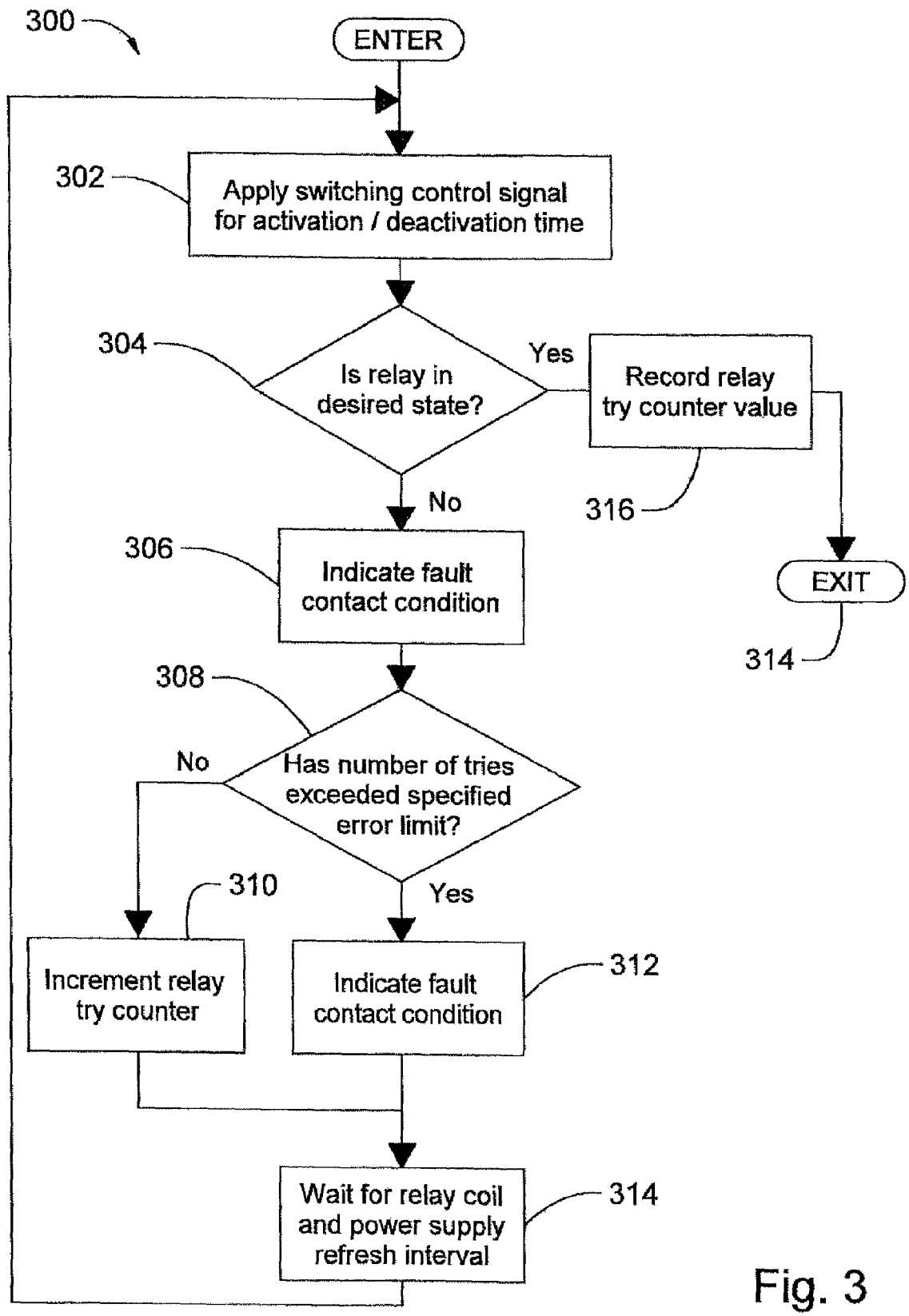
FIG. 3 is a flow chart of a second embodiment of a method for controlling the operation of a relay controller.

A second embodiment of a method for controlling operation of a relay controller is generally referenced at 300 as shown in FIG. 3. The method begins by applying a switch signal to the relay at step 302, and then compares the expected state of the relay contacts to an actual state of the relay contacts at step 304. If no disparity exists between the actual state of the relay contacts and the expected state of the relay contacts, the method proceeds to 318 (the relay try counter is at zero at step 316 if contacts are in expected state). If a disparity is detected at step 304, the method indicates or communicates the fault condition at step 306. At step 310, the method also increments the number of tries, or times that the relay is signaled or pulsed to switch the relay to a desired state. At step 314, a refresh interval is applied before returning to step 302 to repeat the signal for switching the relay contacts. The method determines whether the relay pulse counter has reached a predetermined maximum at step 308. If the predetermined maximum has not been reached, the relay pulse counter is incremented by one (step 310), and the method is repeated. If the predetermined maximum is reached at step 308, a service requirement or communication signal is issued at step 312. The method is followed until no disparity exists between the actual state of the relay contacts and the expected state of the relay contacts, or the predetermined maximum has been reached at step 308.

For purposes of illustration only, the method 300 may control operation of a relay controller as described in the following exemplary scenario. A fault contact condition first occurs after 100,000 switches or cycles of the relay, and requires three pulses of the relay to overcome the condition. A second fault contact condition occurs at 120,000 cycles, and requires four pulses of the relay to overcome. A third fault contact condition occurs at 129,000 cycles, and requires five pulses to overcome. For each of these fault conditions, the processing device has stored the number of cycles or switches the relay has accumulated at the time of the fault condition, and the number of pulses requires to overcome the fault condition and restore the relay to expected operation. After a preset number of intermittent fault contact conditions (such as the three above), the processing device may predict a subsequent failure at 141,000 switches. The processing device may communicate a service requirement to an interface or display device that includes the predicted failure. A response to the service requirement can entail a technician ordering a replacement relay controller, or replacing the relay within a minimum time frame. This progression has been purely exemplary, and a different number of switches, fault contact conditions, and pulses may be stored and/or analyzed in various manners for predicting a fault or failure condition of the relay to be communicated to provide notice of the predicted failure.

In another aspect of the present disclosure, various methods for controlling switching of a relay are provided. The life expectancy and failure of a relay may be related to the manner of operating and switching the relay. Thus, operating the relay in a specific manner can extend the life of the relay. For example, in applications with AC sources, the voltage applied to the relay varies between a positive voltage and negative voltage, and closing the contacts at a point in time where a potential difference (voltage potential) between the two contacts can lead to a sparking/arcing between the contacts just before closure. This sparking/arcing can accelerate the degradation of the relay contacts, resulting in a shorter relay life. Where one relay contact is connected to one branch of a voltage source that transitions between positive voltage and negative voltage, and another relay contact controls a load connected to another branch of the voltage source that transitions between positive voltage and negative voltage, the changing voltage in both branches of the voltage source create situations in which the differential voltage potential between the contacts is zero (eg. —when one leg of a 208 volt Y-configuration with ground is at a positive voltage value and another leg of 208 volt three phase power source is at the same positive voltage value).

Figure 4A:
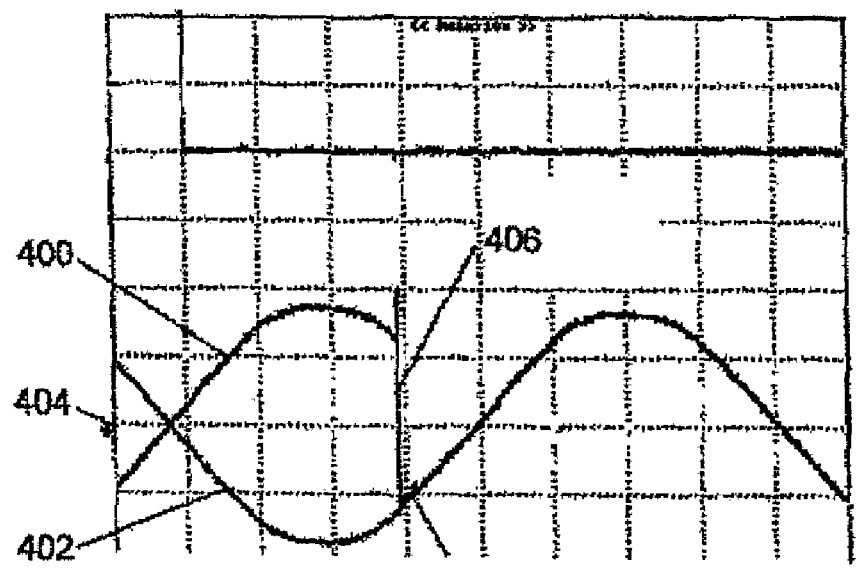
FIG. 4A is a voltage waveform illustrating a contact closure not at a waveform-crossing.
Figure 4B:
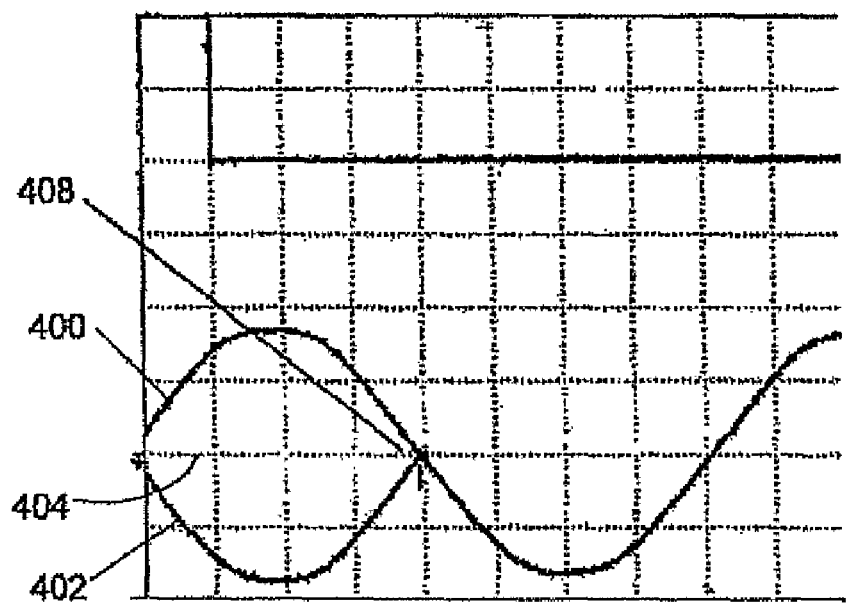
FIG. 4B is a voltage waveform illustrating a contact closure at a cross point of two waveforms.

As seen in FIGS. 4A and 4B, the voltage source is an AC source, similar to a sine wave. FIG. 4A illustrates a voltage 400 on one relay contact and a common voltage 402 on another relay contact. A ground reference 404 is also shown. A contact closure occurs at line 406 when there is a voltage potential or difference between voltage waveform 400 and voltage waveform 402. At line 406, the voltage potential between the contacts (difference between the positive voltage value of 400 and negative voltage value of 402) generally can lead to sparking/arcing between the relay contacts. Alternately as shown in FIG. 4B, a contact closure occurs at line 408 when the difference between the voltage value in waveform 400 and the voltage value in waveform 402 are at a minimum (both waveforms are at about the same value). By closing at or near the crossing point of the waveforms where the difference or voltage potential between the waveforms is minimal, the contacts can be closed without risk of sparking/arcing. The prevention of sparking/arcing between the contacts inhibits the accelerated degradation of the relay.

Figure 5:
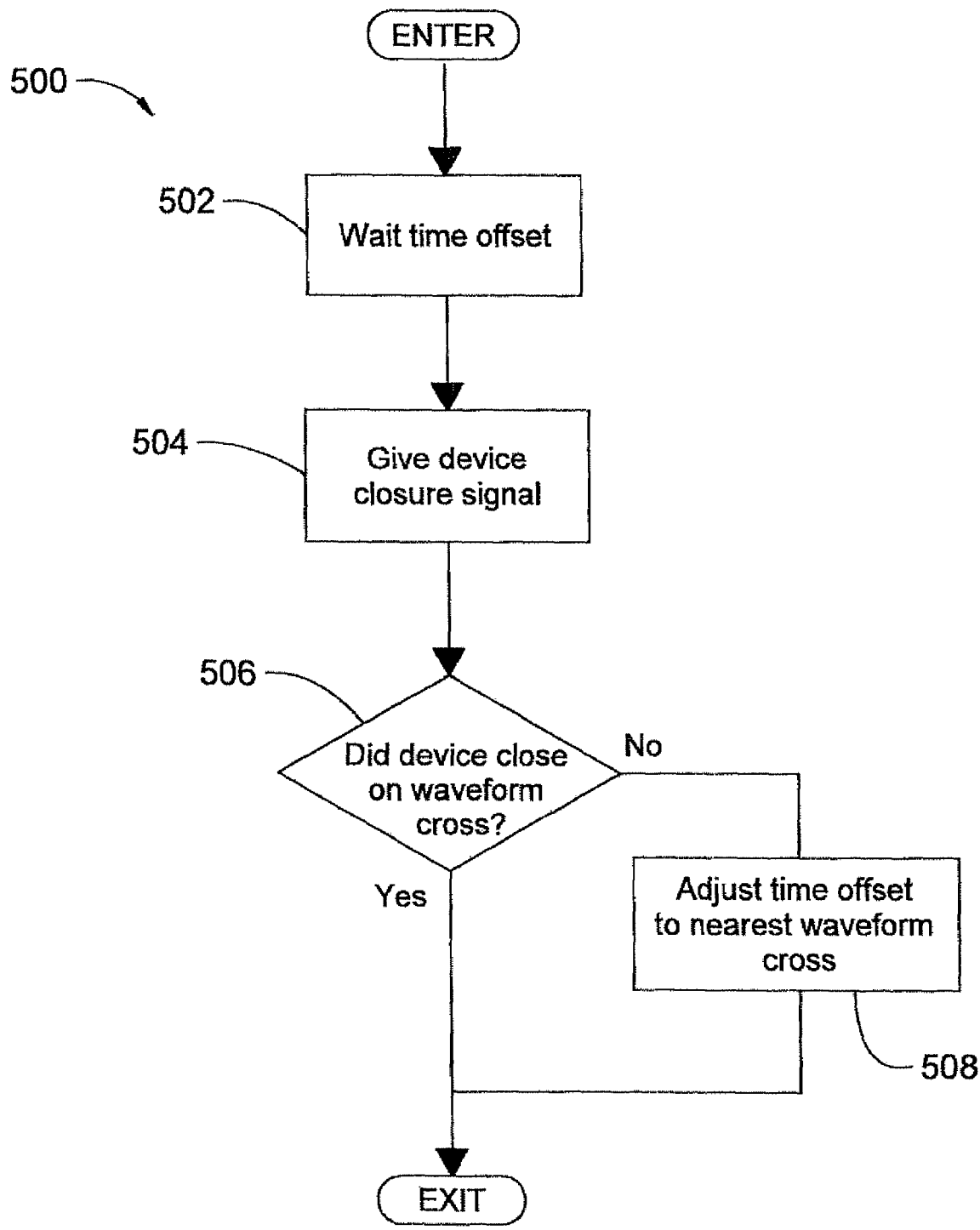
FIG. 5 is a flow chart of a third embodiment of a method for controlling a relay controller that includes an offset.

A third embodiment of a method for controlling the operation of a relay controller is generally referenced at 500 as shown in FIG. 5. The method is adapted to control switching of a relay to close the relay contacts connected to a power source at a minimum voltage potential, or near the crossing of the voltage waveforms. The method comprises an offset sequence 500 that includes monitoring the contact closure of the relay with respect to the crossing of the waveforms of the power source, and adjusting the time offset to minimize the time difference between the contact closure and the crossing of the waveforms. The time offset is a variable time value that is tuned to ensure that the closure of the contacts and the waveform-crossing coincide. The method also includes utilizing the time value or offset in commanding a closing of the contacts of the relay. The time value for commanding a closing of the contacts of the relay allows the contact closure to coincide with the waveform-crossing of the power source, essentially implementing the time offset. The method may adjust the offset time value of the contact closure by a value in the range of 20 to 150 milliseconds. The time offset achieved by the controller offset sequence 500 may be tailored to the specific relay embodiment, and it should be understood that various controller logics can be employed to adjustor offset the contact closure of a relay based on requirements of other implementations of the invention.

Figure 6:
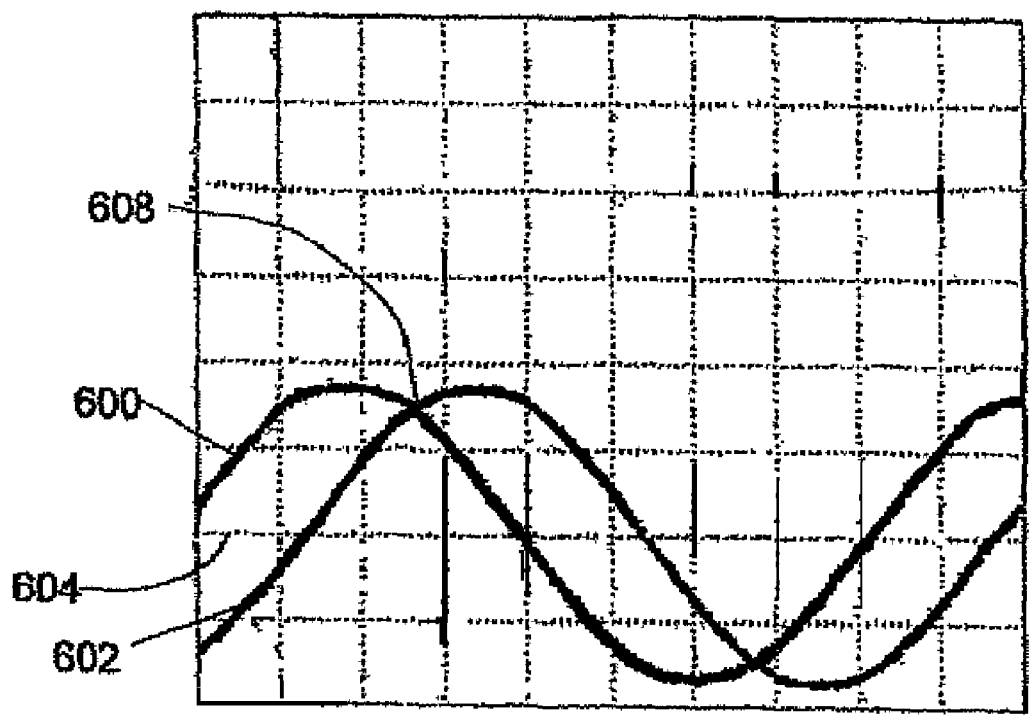
FIG. 6 is a voltage waveform illustrating a contact closure at a cross point of two waveforms of a 208 AC voltage source used in a Y-configuration with respect to ground.

Referring to FIG. 6, two waveforms of a 208 AC voltage source used in a Y-configuration with respect to ground are shown. The voltage source is an AC source, having waveforms similar to a sine wave. One voltage waveform 600 is electrically applied to one relay contact and another voltage waveform 602 is applied to a load in connection with another relay contact. A ground reference 604 is also shown. A contact closure occurs at point 608 when the voltage waveforms 600 and 602 are at a crossing point. At points other that 608, the voltage potential between the contacts (difference between the voltage value of 600 and voltage value of 602) generally can lead to sparking/arcing between the relay contacts. A contact closure occurring at crossing-point 608 where the difference between the voltages in waveform 600 and 602 are at a minimum (both waveforms are at about the same value). It should be noted that such waveform crossing is not the same as "zero-crossing", and that a significant voltage potential exists between the contacts when either waveform 600 or 602 crosses zero volts. By closing at or near the crossing point of the waveforms where the difference or voltage potential between the waveforms is minimal, the contacts can be closed without risk of sparking/arcing. The prevention of sparking/arcing between the contacts inhibits the accelerated degradation of the relay.

Figure 7:
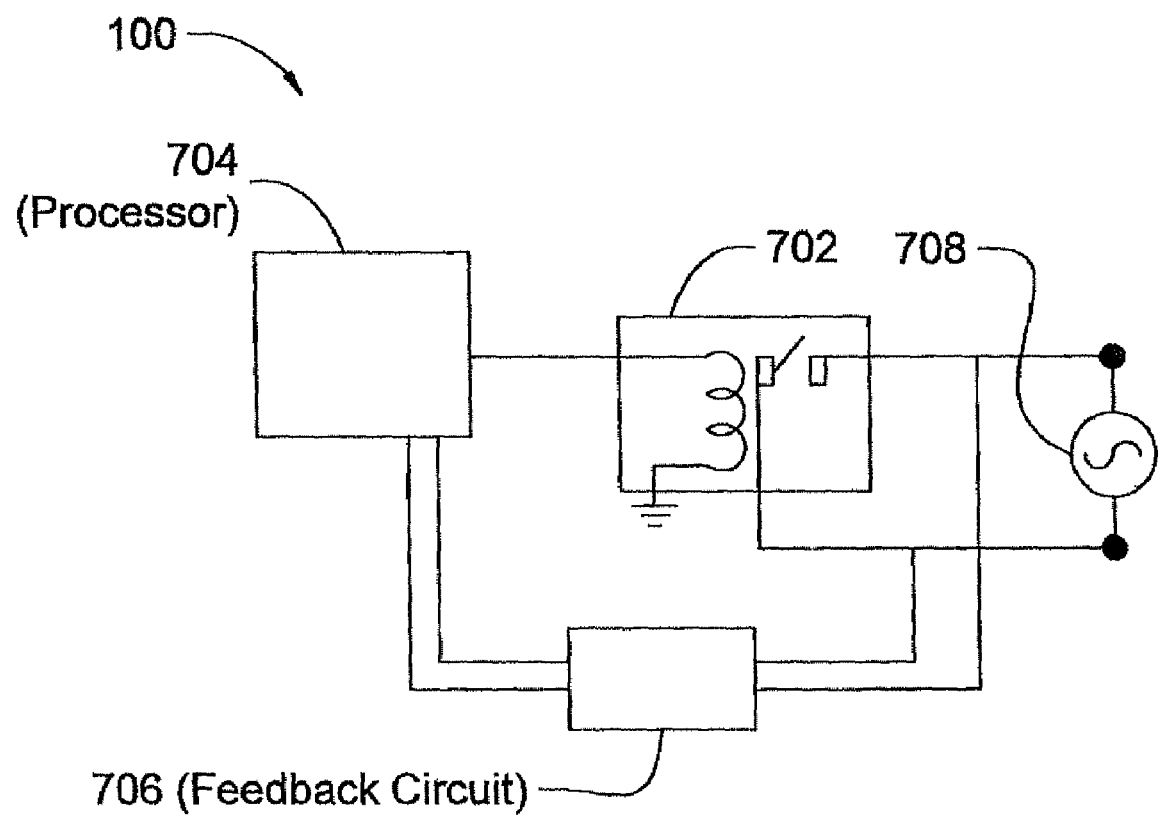
FIG. 7 is a block representation of a second embodiment of a relay controller circuit.

A second embodiment of a relay controller is illustrated in FIG. 7, and is generally referenced by numeral 700. The relay controller 700 includes a relay 702, a processing device 704, and a feedback circuit 706. The feedback circuit is adapted to allow the processing device to detect the actual state of the contact and allow the processing device to detect the waveform-crossing of a power source 708. As shown in FIG. 7, a block representation of a climate control system 710 includes the relay controller 700. It should be understood that a climate control system is only one implementation of the invention, and various other implementations exist for relay controllers within the scope of this invention.

Figure 8:
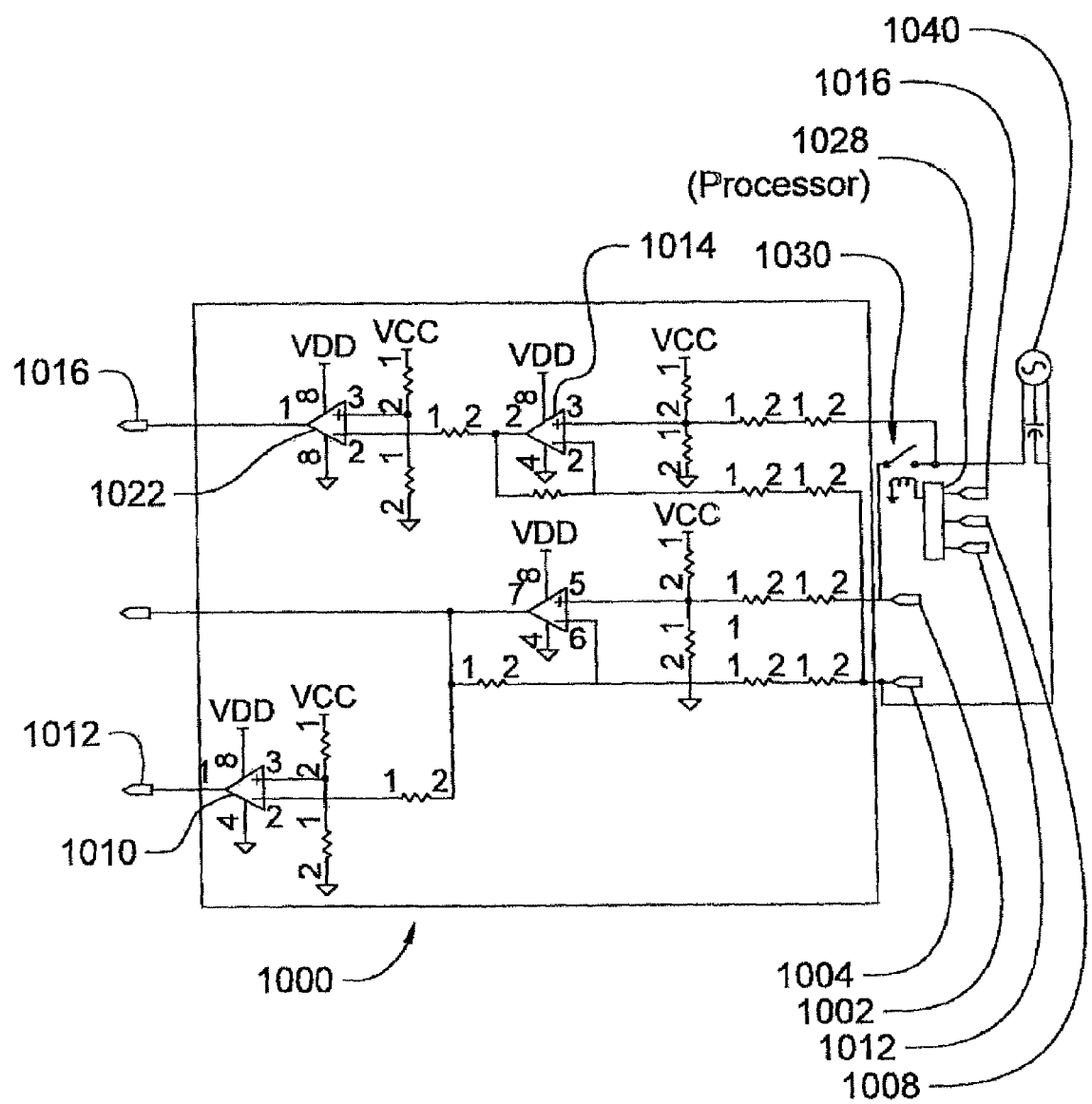
FIG. 8 is a circuit diagram of one embodiment of a feedback circuit for a relay controller shown in FIG. 7.

FIG. 8 is a schematic diagram of a feedback circuit 1000 that may be employed in the second embodiment of a relay controller 700 above. The feedback circuit 1000 includes several resistors and four dual operational amplifiers 1006, 1010, 1014, and 1022 that provide inputs to a microprocessor 1028, which controls a relay 1030 for switching line voltage to a motor 1040. When an AC power source is connected to input pins 1002 and 1004, operation amplifier 1006 outputs an AC signal to a microprocessor input pin 1008, which monitors the voltage value. An operational amplifier 1010 outputs a direct current (DC) square wave to microprocessor input pin 1012. The rising and falling edges of the DC square wave (pin 1012) coincide with the pin 1008 waveform intersecting another waveform of the power source (i.e. zero-voltage potential between the AC waveforms). Thus, transitions in the DC square wave input pin 1012 denote the waveform crossings of the AC power waveforms supplied to pins 1002 and 1004.

The voltage across the motor 1040, which is switched by a relay 1030 that is controlled by the microprocessor 1028, is monitored by an operational amplifier 1014. Based on the signal at input pin 1012, the microprocessor switches the relay 1030 and calculates a time offset with respect to the waveform-crossing point and the closing of the relay contacts. When the relay contacts close to cause the voltage across the motor 1040 to be sensed by operational amplifier 1014, a direct current square wave is output from operational amplifier 1022 to the microprocessor input pin 1016. The microprocessor is adapted to calculate the difference (if any) in time between the relay contact closure from input pin 1016 and the waveform-crossing from input pin 1012. That difference is added or subtracted (as appropriate) to adjust the offset time, for subsequently switching the relay 1030 such that the relay contacts close at or near the waveform cross point where the voltage potential between the waveforms is minimized, as described in FIGS. 4A, 4B, and FIG. 6. This feedback circuit 1000 and its operation should be understood to be one preferred embodiment of the present invention. It should be noted that the feedback circuit, microprocessor 1028 and relay 1030 may be integrated into a single relay controller device. Other circuits and different components can be employed to create a feedback circuit within the scope of the invention.

Figure 9:
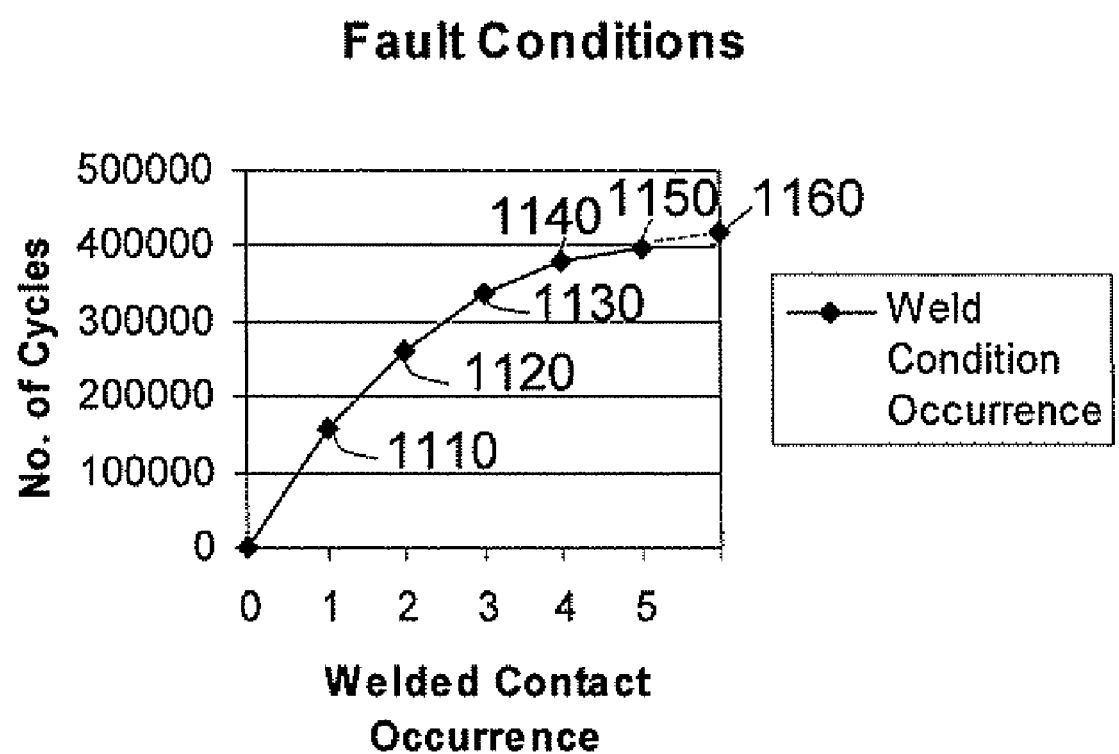
FIG. 9 is a graph exemplifying relay operation over time using a relay controller and method of the present disclosure.

Referring to FIG. 9, a graph illustrates a ninth embodiment of a method for operating a relay controller. The processing device commands the switching of the relay contacts as required for the application. The method comprises detecting a first fault weld condition by a disparity between an expected position of the relay and the actual position of the relay, and storing the number of switches (or cycles) the relay made as of the contact weld fault condition. The method pulses the relay a number of times until the weld condition is overcome, and stores the number of pulses required to overcome the welded contact failure condition. The method then calls for detecting a second weld condition and storing the number of relay switches when the weld condition occurred, subsequently pulsing the relay a number of times until the second weld condition is overcome, and stores the number of pulses required to overcome the second weld condition. The method also provides for determining a predicted failure of the relay contacts based on the number of fault conditions relative to the number of relay switching occurrences, the number of pulses required to overcome the relay weld condition, or both. For example, empirical testing of a specific relay type may show that after 6 or more pulses, the welded relay contacts will not likely be able to be corrected. The method may use numerical analysis methods, such as linear or geometric progressions, to estimate when the relay will fail based on the progression of the number of pulses required to correct the weld fault, or the progression of the number of weld fault conditions relative to the number of relay switching cycles, or a combination of both. The graph in FIG. 9 illustrates this method by way of example of a hypothetical series of relay contact weld fault conditions. A first contact weld fault condition occurring at 159,000 cycles requiring 2 pulses to overcome the weld is shown at 1110. A second contact weld fault condition occurring at 259,000 cycles requiring 2 pulses to overcome the second weld is shown at 1120. A third contact weld fault condition occurring at 339,000 cycles requiring 3 pulses to overcome the third weld is shown at 1130. A fourth contact weld fault condition occurring at 379,000 cycles requiring 4 pulses to overcome the fourth weld is shown at 1140. A fifth contact weld fault condition occurring at 399,000 cycles requiring 5 pulses to overcome the fifth weld is shown at 1150. Based on the progression of pulses, the method could predict that the next weld condition could require more than 5 pulses, in which case the relay contact weld condition could likely become permanent. Likewise, based on the progression of the number of fault conditions relative to the number of cycles (eg. 80,000 cycles after $3^{rd}$ fault, 40,000 cycles after $4^{th}$ fault, 20,000 cycles after the $5^{th}$ fault), the method could predict that the next weld condition could occur in approximately 10,000 cycles at 1160 (at 419,000 cycles). Each of the above predicted failure criteria may be implemented individually or in combination with each other to provide for communication of a service report that includes a predicted failure estimation. It should be noted that various algorithms may be employed to weight the weld contact failure condition data, or to combine the progression of the data to compile the data into an estimated predicted welded contact failure event of the relay, for communicating in a service report.

When describing elements or features of the present invention or embodiments thereof, the articles "a", "an", "the" and "said" are intended to mean there are one or more of such elements or features. The terms "comprising", "including" and "having" are intended to be inclusive and mean there may be additional elements or features beyond those specifically described.

Those skilled in the art will recognize that various changes can be made to the exemplary embodiments and implementations described above without departing from the scope of the present invention. Accordingly, all matter contained in the above description or shown in the accompanying drawings should be interpreted as illustrative and not in a limiting sense.

What is claimed is:

1. A controller for establishing electrical connection between a motor and an alternating current power source having a first alternating-current voltage waveform and a second alternating-current voltage waveform, the controller comprising:
   a relay having a first relay contact and a second relay contact adapted to close to establish an electrical connection between a motor and a first alternating-current voltage waveform and second alternating-current voltage waveform, wherein a significant voltage potential exists between the first and second alternating-current voltage waveforms when either the first or second alternating-current voltage waveform crosses zero volts;
   a first electrical circuit having input connections adapted for connection to the first and second alternating-current voltage waveforms, the first electrical circuit being configured to provide a signal denoting a time when each of the first and second alternating-current voltage waveforms are each at a significant voltage value that is greater than 50 percent of the peak voltage of the waveforms, and the difference in voltage potential between the first alternating-current voltage waveform and the second alternating-current voltage waveform is at or near a minimum value, at which time the relay is initially switched to initiate closure of the first and second relay contacts;
   a second electrical circuit having input connections with the first and second relay contacts for monitoring the relay contact position, wherein when the relay first and second contacts are closed, the second electrical circuit is configured to provide a signal denoting a time when the relay contacts have closed and opened;
   a microprocessor configured to switch said relay causing the opening and closing of first and second relay contacts, wherein the microprocessor is configured to monitor the signal of the first circuit and the signal of the second circuit to determine a difference in time between when said relay is initially switched where the difference in voltage potential is at or near a minimum value, and when said first and second relay contacts actually close, where the microprocessor utilizes said time difference value in determining a switch initiation time relative to a time where the difference in voltage potential between the first alternating-current voltage waveform and the second alternating-current voltage waveform is at or near a minimum value, such that the first and second relay contacts close when the voltage potential between the first and second alternating-current voltage waveforms is at or near a minimum value, to thereby reduce the potential for arcing.

2. The controller of claim 1, wherein the microprocessor is configured to provide a voltage pulse to the relay to initiate switching of the relay to cause the contacts to close.

3. The controller of claim 2 wherein the microprocessor is further configured to initiate switching of the relay to cause the contacts to move to an open position.

4. The controller of claim 3 wherein the microprocessor is configured to monitor the signal of the second circuit to detect a disparity between the expected position of the relay's contacts and an actual closed position of the relay's contacts, indicative of a welded relay contact condition.

5. The controller of claim 4 wherein the microprocessor is operable to pulse the relay with a voltage signal to overcome the fault contact condition.

6. The relay controller of claim 5 wherein the processing device is adapted to store pulse characteristics including at least the number of pulses necessary to overcome the fault contact condition.

7. The controller of claim 4 wherein the first and second electrical circuits are first and second operational amplifiers.

8. The controller of claim 7 wherein the first electrical circuit is configured to determine the time when said difference in voltage potential between the first alternating-current voltage waveform having a significant voltage value relative to zero volts and the second alternating-current voltage waveform having a significant voltage value relative to zero volts is at or near a minimum value.

9. A controller for establishing electrical connection between a motor and an alternating current power source having a first alternating-current voltage waveform and a second alternating-current voltage waveform, the controller comprising:
   a relay having a first relay contact and a second relay contact adapted to close to establish an electrical connection between a motor and a first alternating-current voltage waveform and second alternating-current voltage waveform, wherein a significant voltage potential exists between the first and second alternating-current voltage waveforms when either the first or second alternating-current voltage waveform crosses zero volts;
   a first electrical circuit having input connections adapted for connection to the first and second alternating-current voltage waveforms, the first electrical circuit being configured to provide a signal denoting a time when a difference in voltage potential, between the first alternating-current voltage waveform having a significant voltage value greater than 50 percent of the peak voltage of the first alternating-current voltage waveform and the second alternating-current voltage waveform having a significant voltage value greater than 50 percent of the peak voltage of the second alternating-current voltage waveform, is at or near a minimum value, at which time the relay is initially switched to initiate closure of the first and second relay contacts;
   a second electrical circuit having input connections with the first and second relay contacts for monitoring the relay contact position, wherein when the relay first and second contacts are closed, the second electrical circuit is configured to provide a signal denoting a time when the relay contacts have closed and opened;
   a microprocessor configured to switch said relay causing the opening and closing of first and second relay contacts, wherein the microprocessor is configured to monitor the signal of the first circuit and the signal of the second circuit to determine a difference in time between when said relay is initially switched where the difference in voltage potential between the first alternating-current voltage waveform and the second alternating-current voltage waveform is at or near a minimum value, and when said first and second relay contacts actually close, where the microprocessor utilizes said time difference value in determining a switch initiation time relative to a time where the difference in voltage potential is at or near a minimum value, such that the first and second relay contacts close when the voltage potential between the first and second alternating-current voltage waveforms is at or near a minimum value, to thereby reduce the potential for arcing.

10. The controller of claim 9 wherein the microprocessor is configured to provide a voltage pulse to the relay to initiate switching of the relay to cause the contacts to close.

11. The controller of claim 10 wherein the microprocessor is further configured to initiate switching of the relay to cause the contacts to move to an open position.

12. The controller of claim 11 wherein the microprocessor is configured to monitor the signal of the second circuit to detect a disparity between the expected position of the relay's contacts and an actual closed position of the relay's contacts, indicative of a welded relay contact condition.

13. The controller of claim 12 wherein the microprocessor is operable to pulse the relay with a voltage signal to overcome the fault contact condition.

14. The relay controller of claim 13 wherein the processing device is adapted to store pulse characteristics including at least the number of pulses necessary to overcome the fault contact condition.

15. The controller of claim 12 wherein the first and second electrical circuits are first and second operational amplifier circuits.

16. A controller for establishing electrical connection between a motor and an alternating current power source having a first alternating-current voltage waveform and a second alternating-current voltage waveform, the controller comprising:

a relay having a first relay contact and a second relay contact adapted to close to establish an electrical connection between a motor and a first alternating-current voltage waveform and second alternating-current voltage waveform, wherein a significant voltage potential exists between the first and second alternating-current voltage waveforms when either the first or second alternating-current voltage waveform crosses zero volts;

a first operative-amplifier circuit having input connections adapted for connection to the first and second alternating-current voltage waveforms, the first operative-amplifier circuit being configured to provide a signal denoting a time when each of the first and second waveforms are each at a significant voltage value that is greater than 50% of the peak voltage of the alternating-current voltage waveforms, and a difference in voltage potential between the first alternating-current voltage waveform having a significant voltage value and the second alternating-current voltage waveform having a significant voltage value is at or near a minimum value, at which time the relay is initially switched to initiate closure of the first and second relay contacts;

a second operative-amplifier circuit having input connections with the first and second relay contacts for monitoring the relay contact position, wherein when the relay first and second contacts are closed, the second operative-amplifier circuit is configured to provide a signal denoting a time when the relay contacts have closed and opened;

a microprocessor configured to switch said relay causing the opening and closing of first and second relay contacts, wherein the microprocessor is configured to monitor the signal of the first circuit and the signal of the second circuit to determine a difference in time between when said relay is initially switched where the difference in voltage potential between the first alternating-current voltage waveform and the second alternating-current voltage waveform is at or near a minimum value, and when said first and second relay contacts actually close, where the microprocessor utilizes said time difference value in determining a switch initiation time relative to a time where the difference in voltage potential is at or near a minimum value, such that the first and second relay contacts close when the voltage potential between the first and second alternating-current voltage waveforms is at or near a minimum value, to thereby reduce the potential for arcing.

17. The controller of claim 16 wherein the microprocessor is configured to provide a voltage pulse to the relay to initiate switching of the relay to cause the contacts to close.

18. The controller of claim 17 wherein the microprocessor is further configured to initiate switching of the relay to cause the contacts to move to an open position.

19. The controller of claim 18 wherein the microprocessor is configured to monitor the signal of the second circuit to detect a disparity between the expected position of the relay's contacts and an actual closed position of the relay's contacts, indicative of a welded relay contact condition.

20. The controller of claim 19 wherein the microprocessor is operable to pulse the relay with a voltage signal to overcome the fault contact condition.

* * * * *